United States Patent [19]

Villa et al.

[11] Patent Number: 4,886,982

[45] Date of Patent: Dec. 12, 1989

[54] POWER TRANSISTOR WITH IMPROVED RESISTANCE TO DIRECT SECONDARY BREAKDOWN

[75] Inventors: Flavio Villa, Milan; Giovanni Siepe, Novara, both of Italy

[73] Assignee: SGS Microelettronica S.p.A., Catania, Italy

[21] Appl. No.: 135,220

[22] Filed: Dec. 21, 1987

[30] Foreign Application Priority Data

Dec. 30, 1986 [IT] Italy ................................ 22899 A/86

[51] Int. Cl.[4] .................. H03K 17/60; H03K 3/26; G05F 3/16; H01L 27/02
[52] U.S. Cl. .................. 307/254; 307/255; 307/303.1; 307/270; 307/259; 307/302; 323/315; 323/268; 323/272; 357/44; 357/46; 357/35
[58] Field of Search .............. 307/254, 255, 303.1, 307/270, 259, 302; 323/315, 268, 272; 357/44, 46, 35

[56] References Cited

U.S. PATENT DOCUMENTS

| | | | |
|---|---|---|---|
| 4,296,336 | 10/1981 | Skanadore | 307/302 |
| 4,352,057 | 9/1982 | Okada et al. | 323/315 |
| 4,672,235 | 6/1987 | Villa et al. | 307/255 |
| 4,682,197 | 7/1982 | Villa et al. | 357/44 |
| 4,733,196 | 3/1988 | Menniti et al. | 323/315 |

Primary Examiner—Stanley D. Miller
Assistant Examiner—Trong Quang Phan
Attorney, Agent, or Firm—Guido Modiano; Albert Josif

[57] ABSTRACT

This power transistor comprises a plurality of elementary transistors, also indicated as "fingers", having their emitter terminals mutually connected and forming a common emitter terminal, collector terminals also mutually connected and forming a common collector terminal, and base terminals connected to at least one current source. Each elementary transistor is part of a circuit comprising a diode forming, together with the elementary transistor, a current mirror, so that the collector current passing through the elementary transistor is far less sensitive to the temperature gradients which originate inside the power transistor.

5 Claims, 2 Drawing Sheets

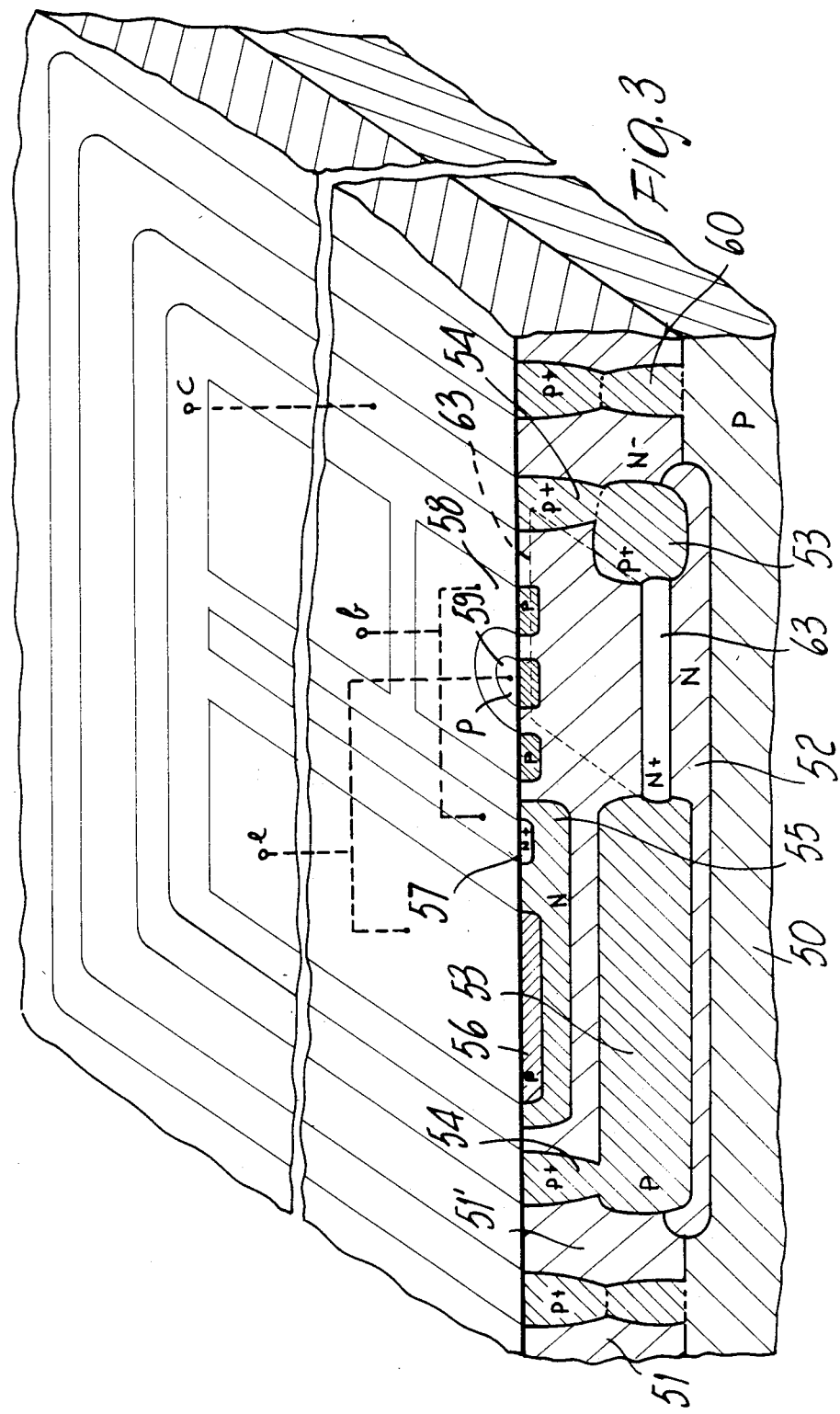

POWER TRANSISTOR WITH IMPROVED RESISTANCE TO DIRECT SECONDARY BREAKDOWN

BACKGROUND OF THE INVENTION

The present invention relates to a power transistor with improved resistance to direct secondary breakdown.

As is known, one of the main reasons of failure in bipolar power transistors is the secondary breakdown. This normally destructive phenomenon limits the performance of these transistors, so that during the design particular care must be taken to avoid the possibility of occurrence of this phenomenon.

The nature of this instability is thermal and constitutes the main obstacle to the achievement of larger safe operating areas in bipolar transistors.

In order to improve the ability of transistors to withstand such stresses, several solutions have already been proposed. In particular, one solution provides the use of so-called ballast resistors, in series to the emitter of each elementary transistor, while the U.K. patent No. 1,467,612 discloses replacing each elementary transistor with a pair of transistors geometrically arranged so as to obtain a compensation of the thermal imabalances, and in the Italian patent application No. 21 028 A/84 filed in the name of the assignee of the present application each elementary transistor is controlled by an own current source so as to reduce electrothermic regeneration phenomena. Such known solutions, though allowing an improvement with respect to previous devices, however allow to reduce only partially the phenomenon of direct secondary breakdown and are not always free from disadvantages.

A more substantial improvement is achieved according to the solution in U.S. Pat. No. 4,682,197 assigned to the assignee of the present application. According to this solution, the power device consists of a plurality of elementary transistors electrically connected but physically spaced apart by an amount equal to 17 mils. In this manner the overall power transistor is capable of delivering a power equal to the sum of the powers related to the individual elementary transistors (cells, or "fingers", the latter term indicating a group of cells). However, the bulk is penalizing and, on the other hand, the solutions indicated in order to minimize the area occupied by the device, such as the insertion, between two adjacent elementary transistors, of drive transistors operating as current sources or of the elementary transistors of the complementary stage, if the device constitutes a class-B output stage, in which the two output transistors operate alternately, are limited in their usefulness, in particular when two metal layers cannot be used.

SUMMARY OF THE INVENTION

Given this situation, the aim of the present invention is to provide a power transistor which eliminates the disadvantages of the solutions according to the prior art, and in particular has an improved resistance to direct secondary breakdown phenomena.

Within this aim, a particular object of the present invention is to provide a power device, the elementary transistors whereof are provided adjacent to one another, without requiring a mutual interspacing of the individual fingers or elementary transistors, so as to not require appreciable increases in the occupied area.

Still another object of the present invention is to provide a power transistor capable of ensuring power levels which can be compared with those obtainable with the structured indicated in the U.S. Pat. No. 4,682,197.

Not least object of the present invention is to provide a power transitor which can be easily integrated using technology and machinery commonly available in the electronics industry and having minimal layout complication, so as to have production costs which are comparable wit the indicated known devices.

The above aim and objects and others which will become apparent hereinafter are achieved by a power transistor with improved resistance to direct secondary breakdown, comprising a plurality of elementary transistors having emitter terminals which are mutually connected and form a common emitter terminal, collector terminals also mutually connected and forming a common collector terminal, and base terminals connected to at least one current source, characterized in that it comprises a plurality of diodes, each of aid diodes being connected to a respective elementary transistor and forming therewith a current mirror circuit.

In practice, according to the invention, each elementary transistor is replaced with a current mirror formed by an output transistor and by a diode having a preset area ratio with respect to one another, so as to maintain the desired gain value of the output transistor, typically 100, while the diode is in practice a stabilization element such as to ensure a smaller sensitivity of the collector current of the output transistor as the operating temperature rises.

BRIEF DESCRIPTION OF THE DRAWINGS

Further characteristics and advantages of the invention will become apparent from the description of some preferred, but not exclusive, embodiments, illustrated only by way of non-limitative example in the accompanying drawings, wherein:

FIG. 3 is a perspective view, in cross section, of a silicon wafer in which an elementary transistor of the type illustrated in FIG. 2 has been integrated.

DESCRIPTION OF THE PREFERRED EMBODIMENTS

Figure 1:
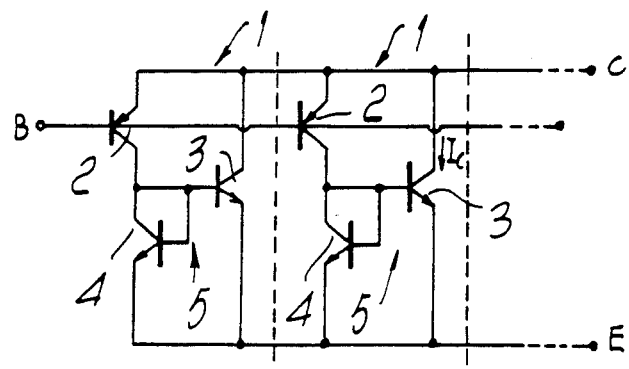
FIG. 1 is a circuit diagram of a first embodiment of the power transistor according to the invention.

With reference to FIG. 1, a first embodiment of the power transistor according to the invention is illustrated, comprising NPN-type devices as output transistors. In detail, the illustrated power transistor consists of a plurality of blocks mutually connected and indicated by the reference numeral 1. In detail, each block 1 consists of a drive transistor 2 of the PNP type, feeding an elementary output transistor 3, here of the NPN type. As can be seen, the bases of the transistors 2 forming the current sources are mutually connected and form the common termnal B of the overall power transistor, their emitters are also connected to one another and to the collectors of the elementary output transistors 3, forming a common collector terminal C, while the collectors of the transistors 2 are each connected to the base of the respective elementary output transistor 3 and with the anode of a respective diode 4, here consisting of a transistor, having its collector and base in short circuit. In practice, the diode 4 and the transistor 3 form a current mirror 5, with preset emitter areas so as to ensure appropriate values of the gain of the output transistor 3. Finally, the emitters of the transistors 3 are mutually connected so as to form a common emitter terminal E and are connected to the emitters of the transistors which form the diodes 4.

By virtue of this structure, the output transistor has a collector current $I_c$ which is less sensitive to temperature variations with respect to known solutions. In fact the temperature variations of the collector current of each individual elementary transistor, when said elementary transistor is controlled by its own current source, are due exclusively to the variations of the current gain $\beta$ with said temperature T. In particular, if the base currents of the individual transistors constituting the current mirror are not ignored, current analysis allows to set the following relation:

$$\frac{1}{I_c} \cdot \frac{\partial I_c}{\partial T} = \left[ \frac{1}{1 + \beta/(1 + m)} \right] \cdot \frac{1}{\beta} \cdot \frac{\partial \beta}{\partial T}$$

The variations of the collector current depending on the tempeature are thus decreased by the factor $$\frac{1}{1 + \beta/(1 + m)}$$

where m is the ratio of the areas of the two transistors constituting the mirror.

The circuit according to FIG. 1 may be easily implemented, by providing the transistor 3 and the diode 4 in two adjacent, but mutually insulated epitaxial pockets. In particular, the diode 4 will be formed by an NPN transistor, having suitable emitter area with respect to transistor, as already explained, and with the base and collector regions mutually short-circuited.

Figure 2:
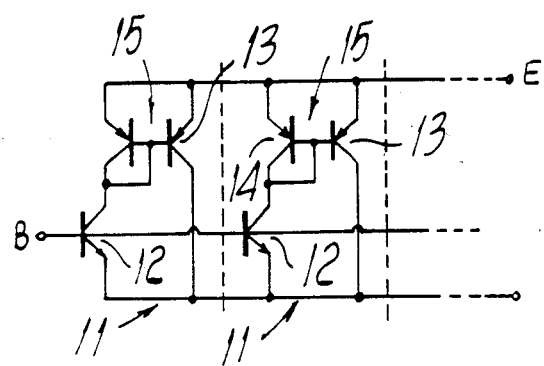
FIG. 2 is an exemplifying circuit diagram of a different embodiment of the invention, with the elementary output transistor of the PNP type.

FIG. 2 illustrates a different solution according to the present invention, wherein the output transistor comprises a PNP-type device. Also in this case, the overall power transistor includes a plurality of mutually connected structures, indicated at 11, each comprising a current source feeding the base of an elementary output transistor which forms a current mirror with a suitable diode. In particular in FIG. 2, each base structure comprises an NPN transistor 12, forming the current source and a current mirror circuit 15 formed by two transistors 13 and 14, of the PNP type, of which the trasistor 13 constitutes the elementary output transistor, the emitter terminal whereof is connected to the common emitter terminal E of the power transistor and the collector terminal whereof is connected to the common collector terminal C of the power transistor, while its base is connected to the collector of the current source transistor 12 and with the base of the transistor 14, diode connected. The transistor 14, which has an emitter area having a specified ratio with respect to the emitter area of the transistor 13, so as to ensure an appropriate output gain, has its emitter terminal connected to the common emitter terminal E of the power transistor and the collector terminal short-circuit with its base and connected to the collector of the transistor 12.

FIG. 3 illustrates a practical embodiment of the circuit schematically illustrated in FIG. 2, with the elementary output transistor provided as an insulated vertical PNP transistor. In detail, the silicon wafer shown in FIG. 3 comprises the P type subtrate 50 and the epitaxial layer 51 of the N− type. P+ type regions 60 formed by means of the top-bottom technique (that is formed both by diffusion in the epitaxial layer from the device main surface and by diffusion from the upper face of the substrate, during the epitaxial layer growth, of implanted ions) insulate, in the epitaxial layer 51, an epitaxial pocket 51', in which the current mirror 15 is provided. The epitaxial pocket 51' accommodates the implanted region 52 of the N type, forming the bottom N-well and the P+ type region 53 forming the collector of the transistor 13 and having portions 54 facing the upper surface of the device. As schematically indicated in broken lines in FIG. 3, the region 53 is opened (that is a hole) in the zone arranged below the diode to allow a heavy diffusion of antimony of the N+ type, indicated at 63 in the figure, having the aim of acting as a mirror for the carriers emitted by the overlying emitter region 59 of the diode. Said region 63 is obtained without process complication by using the mask for the obtainment of all buried layers in the same silicon wafer.

Inside the epitaxial pocket 51' an implanted N region 55 is furthermore provided and defines the top N-well, accommodating the P type region 56 which constitutes the emitter of the transistors 13, and the N+ region 57, enriched for connection to the base contact of said transistor. The transistor defining the diode 14 is provided laterally to the regions 56 and 55, which together weight the region 53 form the transistor 13. In detail, as can be seen, the diode 14 comprises a lateral PNP transistor the base whereof is defined by the epitaxial pocket 51', the collector whereof is formed by the P type layer 58 and the emitter whereof is formed by the P type layer 59. In the example illustrated, the lateral PNP transistor which defines the diode 14 is provided above the buried layer 63, between the two regions 56' (of which only one can be seen in the figure) which together with the region 56 form the emitter of the transistor 13. In turn, the regions 56 and 56' can comprise a plurality of regions, according to known methods. The circuit is completed by the oxide layers (not illustrated) and by the metal layers (also not illustrated, but schematically indicated in the figure by broken lines) so as to define the terminal e connected to the common terminal E of the power transistor, the terminal b connected to the collector of the current source 12 (and mutually short-circuiting the base and collector regions 57 and 58, so as to define the diode 14) and the terminal c connected to the common collector terminal C.

In the figure the current source 12, which can be provided according to known methods, is not illustrated.

As can be seen from th preceding description, the invention fully achieves the intended aims. A structure has in fact been provided which, by using the electric characteristics of the current mirror circuit as a function of temperature, allows to limit the variations of the collector current passing through the elementary output transistor, which are due to the operating temperatures, thus extending the safe operating area, with no risk of direct secondary breakdown. In this manner a direct secondary breakdown value is achieved which is approximate to the one obtained with the abovementioned U.S. Pat. No. 4,682,197, according to which the device could deliver a power equal to the sum of the powers relates to the individual elementary transistors.

Furthermore, with the indicated structure saturation values are obtained which are equal to those obtainable with a standard structure, so that during operation in the region which is not dangerous from the point of view of direct secondary breakdown (S.O.A.=Safe Operating Area) the device behaves like an ordinary one.

Moreover the area required for the implementation of the illustrated blocks is practically equal to that of standard structures.

Finally, the power transistor according to the invention does not entail complications in the layout and requires process steps which are usual in the electronics industry, therefore entailing production costs which are comparable with those of known devices.

The invention thus conceived is susceptible to numerous modifications and variations, all of which are within the scope of the inventive concept. In particular the fact is stressed that the diode of the current mirror can be provided both as an integrated transistor, mutually short-circuiting the base and collector terminals, and employing any technology which provides a PN junction appropriate for the purpose. For example the diode can be provided by means of a appropriately doped polysilicon layer, deposited on the surface of the device.

Moreover all of the details may be replaced with other technically equivalent ones.

It is claimed:

1. A power transistor with improved resistance to direct secondary breakdown, comprising a plurality of elementary transistors having emitter regions which are mutually connected and define a common emitter terminal, collector regions mutually short-connected and defining a common collector terminal, and base regions connected to at least one current source, and a plurality of diodes, each of said diodes being connected between base and emitter regions of a respective elementary transistor of said plurality of elementary transistors and forming therewith a current mirror circuit.

2. A transistor according to claim 1, wherein each of said elementary transistors is of the NPN type, and each of said diodes has an anode terminal connected to a respective one of said base regions of said elementary transistors and a cathode terminal connected to said common emitter terminal.

3. A transistor according to claim 1, wherein each of said elementary transistors is of the PNP type, and each of said diodes has an anode terminal connected to said common emitter terminal and a cathode terminal connected to a respective one of said base regions of said elementary transistors.

4. A power transistor with improved resistance to direct secondary breakdown, comprising a plurality of elementary transistors having emitter regions which are mutually connected and define a common emitter terminal, collector regions mutually connected and defining a common collector terminal, and base regions connected to at least one current source, and a plurality of diodes, each of said diodes being connected between base and emitter regions of a respective elementary transistor of said plurality of elementary transistors and forming therewith a current mirror circuit, wherein each of said elementary transistors comprises an insulated vertical PNP transistor defined in an epitaxial pocket, said epitaxial pocket accommodating one elementary transistor of said plurality of elementary transistors and one diode of said plurality of diode, and said one diode comprises a lateral PNP transistor integrated in said epitaxial pocket and having own emitter, base and collector regions, with said own base and collector regions being short-circuited together, said epitaxial pocket defining simultaneously a base region of said one elementary transistor and said own base region of said lateral PNP transistor.

5. A power transistor with improved resistance to direct secondary breakdown, comprising a plurality of elementary transistors having emitter regions which are mutually connected and define a common emitter terminal, collector regions mutually short-connected and defining a common collector terminal, and base regions connected to at least one current source, and an equal plurality of diodes, each of said diodes comprising a further transistors having own emitter, base and collector regions, with said own base and collector regions being short-circuited together, each of said diodes being connected between emitter and base regions of a respective one of said elementary transistors and forming therewith a current mirror circuit, said emitter regions of said diodes and said emitter regions of said elementary transistors having a preset area ratio.

* * * * *